United States Patent
Humphrey et al.

(10) Patent No.: US 6,586,974 B1
(45) Date of Patent: Jul. 1, 2003

(54) METHOD FOR REDUCING SHORT CIRCUIT CURRENT DURING POWER UP AND POWER DOWN FOR HIGH VOLTAGE PAD DRIVERS WITH ANALOG SLEW RATE CONTROL

(75) Inventors: Guy Harlan Humphrey, Fort Collins, CO (US); Richard A Krzyzkowski, Ft. Collins, CO (US)

(73) Assignee: Agilent Technologies, Inc., Loveland, CO (US)

( * ) Notice: Subject to any disclaimer, the term of this patent is extended or adjusted under 35 U.S.C. 154(b) by 0 days.

(21) Appl. No.: 10/140,767

(22) Filed: May 8, 2002

(51) Int. Cl.⁷ .................................................. H03K 3/00
(52) U.S. Cl. ......................... 327/108; 327/112; 326/82
(58) Field of Search ............................... 327/108, 112; 326/82, 83, 85, 87, 90

(56) References Cited

U.S. PATENT DOCUMENTS

| | | | |
|---|---|---|---|
| 5,581,197 A | 12/1996 | Motley et al. | 326/30 |
| 5,973,368 A | * 10/1999 | Pearce et al. | 257/368 |
| 6,281,729 B1 | 8/2001 | Ang et al. | 327/170 |
| 6,288,563 B1 | 9/2001 | Muljono et al. | 326/27 |
| 6,297,677 B1 | 10/2001 | Ang et al. | 327/170 |
| 6,323,704 B1 | * 11/2001 | Pelley et al. | 327/112 |
| 6,459,325 B1 | * 10/2002 | Hall et al. | 327/391 |

* cited by examiner

Primary Examiner—Tuan T. Lam
Assistant Examiner—Hiep Nguyen

(57) ABSTRACT

A technique for preventing high current shorts through I/O pads of an integrated circuit during power up and power down is presented. In accordance with the invention, the voltage levels of the core power supply that powers the internal circuitry of the integrated circuit and the I/O power supply that powers the input and/or output pad drivers is monitored to detect the condition wherein the core power supply is powered down and the I/O power supply is powered up. Upon detection of this condition, the pad drivers are disabled, preferably by disabling the pre-drivers that generate the pre-drive signals that drive the output driver devices. In a preferred embodiment, the process/voltage/temperature adjustment circuitry is leveraged to disable the output pads during power up and down.

18 Claims, 5 Drawing Sheets

US 6,586,974 B1

METHOD FOR REDUCING SHORT CIRCUIT CURRENT DURING POWER UP AND POWER DOWN FOR HIGH VOLTAGE PAD DRIVERS WITH ANALOG SLEW RATE CONTROL

FIELD OF THE INVENTION

The present invention pertains generally to signal output drivers of integrated circuits, and more particularly to a method for reducing short circuit current during power up and power down for high voltage pad drivers.

BACKGROUND OF THE INVENTION

Integrated circuits communicate with one another using digital signals. The digital state of zero ("0", logic "low") is represented by the range of voltages between a minimum voltage $V_{MIN}$ (e.g., 0 volts) of the potential voltage range of the signal and a voltage $V_{LOW}$ that is low relative to the total range of voltage. The digital state of one ("1", logic "high") is represented by the range of voltages between a voltage $V_{HIGH}$ that is high relative to the total range of voltages and a maximum voltage $V_{MAX}$ (e.g., 1.5 volts) of the potential voltage range of the signal.

To reduce power consumption and to scale down the size of CMOS logic, it is necessary to reduce the internal core power supply voltage. However, the input/output (I/O) pad drivers must typically use a higher-level power supply voltage in order to supply enough current to drive the loads connected to the pad and to meet certain industrial I/O standards such as the JEDEC 8[JEDEC I/O] series of standards. Accordingly, modern integrated circuits generally use a lower-level voltage power supply for the core or internal circuitry and a higher-level voltage power supply for the I/O circuitry. For example, a given integrated circuit may use a 1.5 V power supply for the core power supply and a 3.3±0.3 V power supply for the I/O power supply.

In order to provide a better understanding of the invention, a standard prior art output pad driver will first be discussed. FIG. 1 depicts a schematic block diagram of a conventional output driver circuit 10. As known in the art, the typical output driver circuit includes a pull-up leg 20 and a pull-down leg 30. Each leg 20, 30 typically includes a level shifter 26, 36 having an input coupled to receive a respective core-level data signal $PU_{VDD}$, $PD_{VDD}$. The level shifter 26, 36 steps up the voltage of the data signal from VDD to VDDH when the respective input data signal $PU_{VDD}$, $PD_{VDD}$ is high. Each leg 20, 30 also includes a pre-driver stage 22, 32 (typically implemented with at least one complementary CMOS inverter) having an input coupled to receive a respective stepped-up data signal $PU_{VDDH}$, $PD_{VDDH}$. The pre-driver stage 22, 32 produces pull-up and pull-down pre-drive signals PU_DRV, PD_DRV used to respectively control a pair of output driver pull-up and pull-down devices 24, 34. When enabled by its respective pre-drive signal PU_DRV, PD_DRV, one of the pull-up or pull-down devices 24, 34 drives the output pad 6 to a respective high or low logic level.

Typically, the output driver pullup and pulldown devices 24, 34 are complementary FET devices. In particular, the output driver pullup device 24 is a PFET having a source electrically coupled to the I/O power supply and a drain connected to the output pad. The gate of the PFET 24 is driven by the pullup pre-drive signal PU_DRV. Accordingly, when PU_DRV is driven low, PFET 24 turns on and drives the output pad to VDDH. Similarly, the output driver pulldown device 34 is an NFET having a source electrically coupled to the chip ground and a drain connected to the output pad. The gate of the NFET 34 is driven by the pulldown pre-drive signal PD_DRV. Accordingly, when PD_DRV is driven high, NFET 34 turns on and drives the output pad 6 to ground.

FIG. 2 is a schematic diagram of a conventional level shifter 100. In the illustrative embodiment, the level shifter 100 receives a single-ended core-voltage-level signal IN on an input node 101. Level shifter 100 converts the single-ended input signal IN to a differential input signal IN_N, IN_NN on nodes 102, 103. As known in the art, a differential signal comprises a pair of complementary signals. Level shifter 100 steps up the voltage level of the differential input signal IN_N, IN_NN to produce a differential output signal (OUT, OUT_N) on respective output nodes 104, 105.

In the illustrative embodiment, the level shifter 100 comprises two inverters 110, 115 connected in series to produce the differential input signal pair IN_N, IN_NN. In particular, a first inverter 110 receives at a first input node 101 the single-ended input signal IN, and produces on node 102 the first half IN_N of the differential input signal pair IN_N, IN_NN. The second inverter 115 inverts the signal IN_N received on node 102 and produces on node 103 the complementary half IN_NN of the differential input signal pair IN_N, IN_NN. In the preferred embodiment, inverters 110 and 115 are complementary CMOS inverters each comprising a PFET 111, 116 and an NFET 112, 117. The PFETs 111, 116 and NFETs 112, 117 are both gate-connected to the respective inverter input node 101, 102 and drain-connected to the respective inverter output node 102, 103. The source of the PFET 111, 116 of each inverter 110, 115 is connected to the core-voltage-level power supply VDD and source of the NFET of each inverter 110, 115 is connected to ground. The operation of complementary CMOS inverters is well-known in the art.

Differential input signal IN_N, IN_NN is fed into a level shifter 120. Level shifter 120 is constructed with a pair of input NFETs 121, 122, each having a source connected to ground and drain connected to a complementary output node 104, 105. The gate of respective input NFETs 121, 122 is connected to respective differential input node 102, 103; hence the respective amplifier input NFET 121, 122 is controlled by respective differential input signals IN_N, IN_NN.

Level shifter 120 also includes a pair of output PFETs 123, 124, each having a source connected to the high-voltage-level power supply VDDH and a drain connected to a respective differential output node 104, 105. The gate of respective output PFETs 123, 124 is connected to the complementary respective output nodes 105, 104 of the level shifter 120. The output PFETs 123, 124 are relatively weak compared to the input NFETs 121, 122 to allow the output signals OUT, OUT_N to be easily overdriven by the NFETS 121, 122.

During normal operation, when the input signal IN is a "$1_{VDD}$", differential input signals IN_N, IN_NN are "$0_{VDD}$" and "$1_{VDD}$" respectively. When signal IN_N is "$0_{VDD}$", input NFET 121 is off. Meanwhile, since signal IN_NN is "$1_{VDD}$", input NFET 122 is on, pulling complementary output node 105 to ground. Accordingly, complementary differential output signal OUT_N is "$0_{VDDH}$". When complementary output signal OUT_N is "$0_{VDDH}$", output PFET 123 turns on to pull output node 104 to VDDH. Hence, differential output signal OUT is "$1_{VDDH}$". Accordingly, the level shifter operates to convert a "$1_{VDD}$"

(i.e., high voltage level of VDD) seen at the input 101 of the level shifter to a "$1_{VDDH}$" (i.e., high voltage level of VDDH) on the output node 104 of the level shifter 10.

When the input signal IN is a "$0_{VDD}$", differential input signals IN_N, IN_NN are "$1_{VDD}$" and "$0_{VDD}$" respectively. When signal IN_NN is "$0_{VDD}$", input NFET 122 is off. Meanwhile, since signal IN_N is "$1_{VDD}$", input NFET 121 is on, pulling output node 104 to ground. Accordingly, output signal OUT is "$0_{VDDH}$". When complementary output signal OUT_N is "$0_{VDDH}$", output PFET 124 turns on to pull output node 105 to VDDH. Hence, complementary differential output signal OUT_N is "$1_{VDDH}$". Accordingly, when the input signal IN is a "$0_{VDD}$", the level shifter 100 outputs a "$0_{VDDH}$" on the output node 104 of the level shifter 100. (Of course, since a logical "0" is defined as ground in both the core- and I/O-level power supplies, "$0_{VDDH}$" equals "$0_{VDD}$").

During power up or power down of the integrated circuit, there is a possibility that the core-level power supply VDD may be low at the same time that the I/O power supply VDDH is high. When this situation occurs, both differential input signals IN_N and IN_NN will be low. Hence, the output signals OUT and OUT_N will both be high simultaneously, which can result in both the pull-up and pull-down output driver legs 20, 30 to actively drive the pad 6 (FIG. 1) at the same time. If output signals OUT and OUT_N are both high simultaneously, then from FIG. 1 is it seen that both of the pull-up and pull-down devices 24, 34 may be turned on simultaneously, leading to a high current short between the high power supply VDDH and ground through the pad 6. This situation is undesirable as it may damage the power supply VDDH and the electrical components electrically connected to the pad.

Accordingly, a need exists for a technique for preventing high current shorts through the output pads of an integrated circuit during power up and power down of the circuit.

SUMMARY OF THE INVENTION

The present invention eliminates the risk of high current shorts between the power rails through the pad by disabling the pad drivers at least in the situation when the I/O power supply is powered up while the core power supply is not powered up. The pad drivers are preferably disabled by disabling the pre-drivers that generate the pre-drive signals that drive the output driver devices. In a preferred embodiment, the process/voltage/temperature adjustment circuitry is leveraged to disable the output pads during power up and down.

A preferred embodiment of an output driver implemented in accordance with the principles of the invention includes a level shifter circuit followed by a pre-driver circuit which drives a driver device. A power supply monitoring circuit monitors the voltage levels of the core and I/O power supplies, and generates a disable signal when the I/O power supply is powered up while the core power supply is powered down. An output driver disable circuit actively places the output driver device into a disabled state whenever the disable signal is generated.

In a preferred embodiment, process/voltage/temperature circuitry present in the output driver for controlling the slew rate of the signal driven onto the output pad during normal operation (i.e., when both power supplies are powered up) is leveraged to disable the pre-driver circuit during power up or power down of the integrated circuit.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and circuit for preventing short circuit current during power up and power down of high voltage pad drivers is described in detail hereinafter. Although the invention is described in terms of specific illustrative embodiments, such as specific output driver designs, it is to be understood that the embodiments described herein are by way of example only and that the scope of the invention is not intended to be limited thereby but is intended to extend to any embodiment that controls the output signal edge rate by adjusting the resistance in the pre-driver circuit to control the slope of the pre-drive signal.

Figure 1:
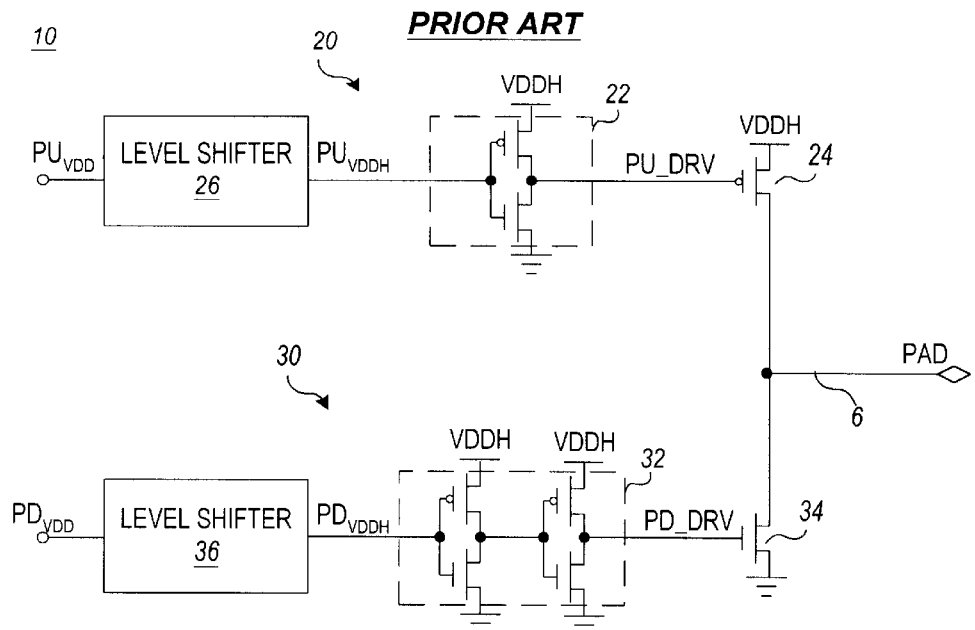
FIG. 1 is a schematic block diagram of a prior art output driver.
Figure 3:
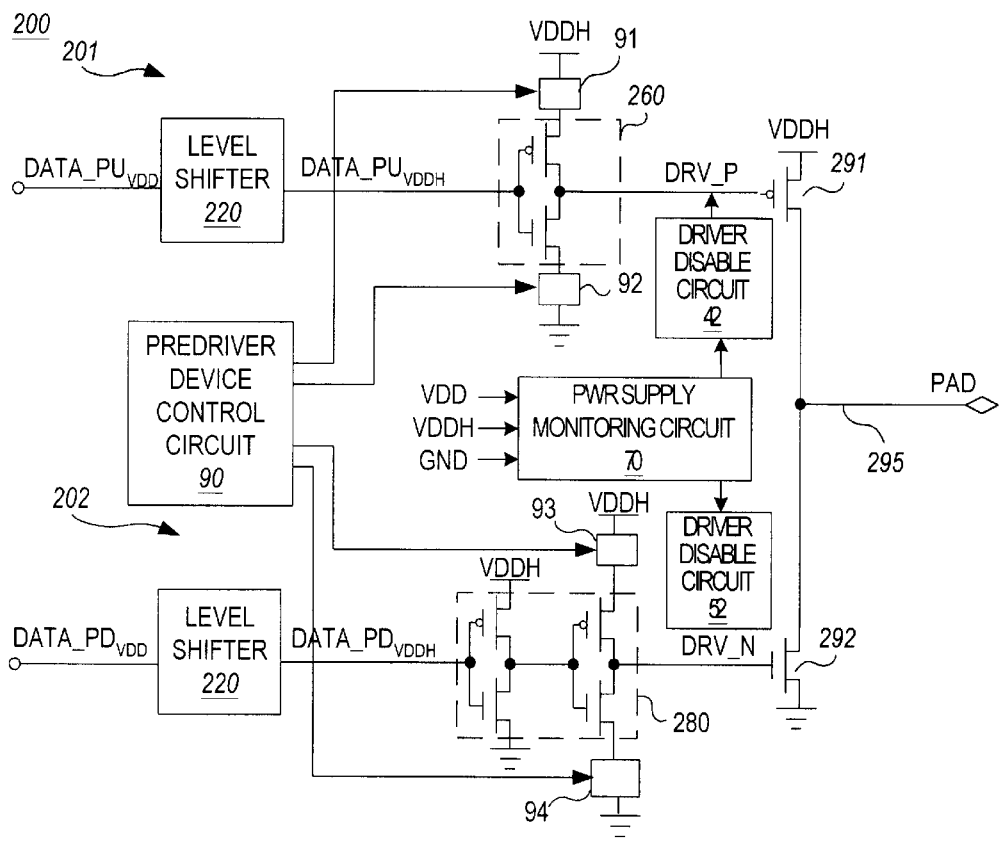
FIG. 3 is a schematic block diagram of an output driver implemented in accordance with the principles of the invention.

Turning now to the invention, FIG. 3 is a schematic block diagram of an output driver 200 according to the principles of the invention. To eliminate the possibility of a high-current short through the output pad 295 during power up and power down of the integrated circuit, the invention includes the following improvements: (1) both the pull-up leg 201 and the pull-down leg 202 include an output driver disable circuit 42, 52; and (2) the output driver 200 preferably includes process/voltage/temperature adjustment circuitry, including a pre-driver device control circuit 90 and predriver current control devices 91, 92, 93, 94.

Figure 2:
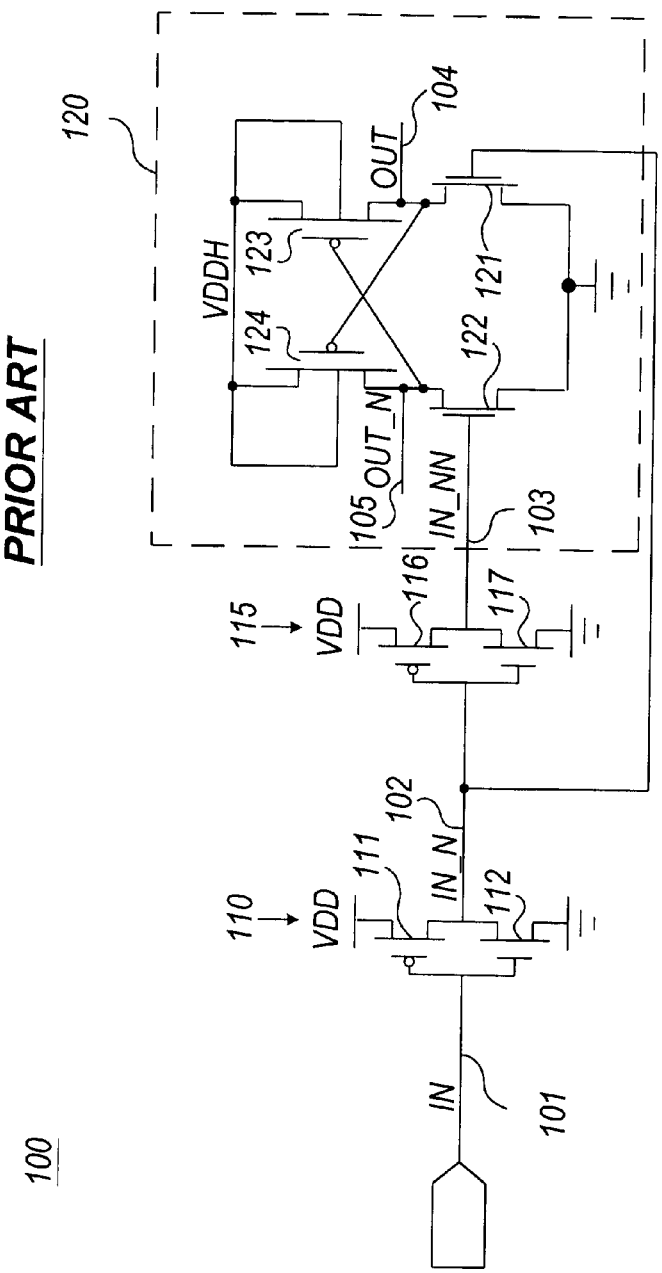
FIG. 2 is a schematic diagram of a conventional level shifter circuit.
Figure 4:
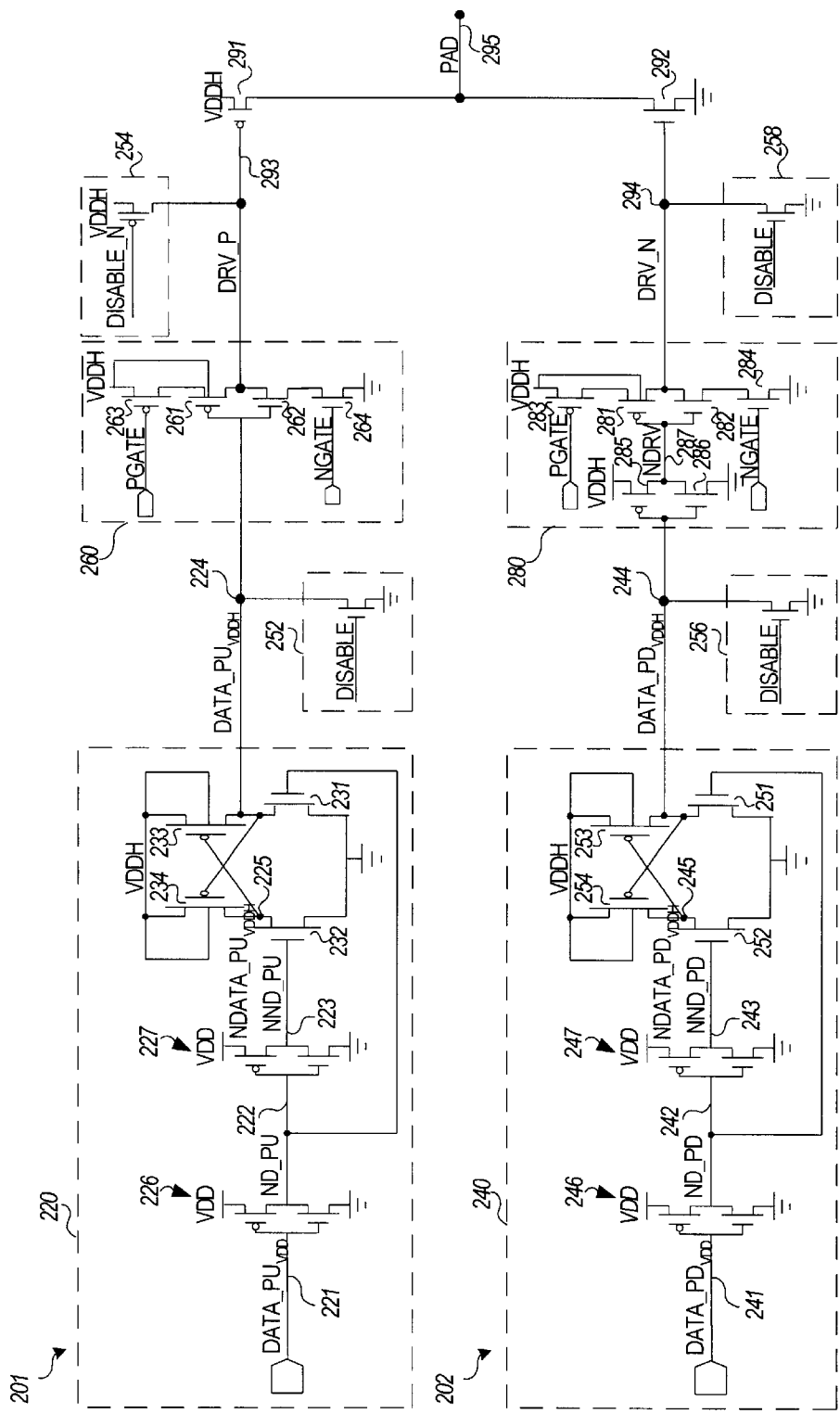
FIG. 4 is a schematic diagram of a preferred embodiment of an output driver implemented in accordance with the principles of the invention.

FIG. 4 is a schematic diagram illustrating a preferred embodiment output driver circuit 200 implemented in accordance with the invention. As illustrated, the output driver circuit 200 includes a pull-up leg 201 and a pull-down leg 202, each configured to drive an output pad 295. The pull-up leg 201 includes a dedicated pull-up level shifter 220 which receives a pull-up data signal DATA_PU$_{VDD}$ at an input 221. The pull-up level shifter 220 operates identically to the conventional level shifter described in FIG. 2, ultimately generating a level-shifted version DATA_PU$_{VDDH}$ of the pull-up data signal DATA_PU$_{VDD}$ at an output 224. In particular, series connected inverters 226 and 227 generate pullup differential input signals ND_PU and NND_PU on nodes 222 and 223, which are used to control the input NFETs 231 and 232 respectively. The drains of the input NFETs 231 and 232 are cross-coupled to control the gates of respective output PFETs 234 and 233, which generate a differential output signal pair DATA_PU$_{VDDH}$, NDATA_PU$_{VDDH}$ on nodes 224 and 225 respectively. The output of the pull-up level shifter 220 is taken at the positive differential output node 224.

The pull-up leg 201 includes a pre-driver circuit 260 comprising a complementary CMOS inverter comprising a PFET 261 electrically coupled between the I/O power supply VDDH at its source and a pullup pre-driver output line 293 at its drain, and an NFET 262 electrically coupled between ground at its source and output line 293 at its drain. The input of the complementary CMOS inverter is formed by connecting the gates of both PFET 261 and NFET 262 to line 224. Accordingly, the pre-driver circuit 260 receives the level-shifted output signal DATA_PU$_{VDDH}$ on line 224 and outputs a pre-driver output signal DRV_P at the output of the pre-driver circuit 260 on line 293.

The pre-driver output signal DRV_P drives the pullup output driver 291. In the preferred embodiment, the pullup output driver 291 is implemented with a PFET with large drive strength. PFET 291 is electrically coupled between the I/O power supply VDDH at its source and the output pad 295 at its drain. The pre-driver output line 293 is electrically coupled to the gate of PFET 291 such that the pre-driver output signal DRV_P controls whether PFET 291 is turned to an ON state to drive the output pad 295 to a "$1_{VDDH}$" by electrically connecting the output pad 295 to the I/O power supply, or to an OFF state to isolate the output pad 295 from the I/O power supply VDDH.

In accordance with the invention, the pullup leg 201 includes power up/down pullup output drive disable circuitry 252, 254. The power up/down pullup output drive disable circuitry 252, 254 operates to disable the pullup output driver PFET 291 so that it does not drive the output pad 295 during either power up or power down of the power supplies VDD and VDDH. In the preferred embodiment, the output drive disable circuitry 252, 254 includes a disable circuit 252 which can be configured to pull down the signal DATA_PU$_{VDDH}$ on node 224 to a low logic level ("$0_{VDDH}$"). In the preferred embodiment, disable circuit 252 is implemented with an NFET device having its source electrically coupled to ground, its drain electrically coupled to node 224, and its gate controlled by a signal DISABLE. Signal DISABLE is logically high ("$1_{VDDH}$") whenever VDDH is powered up and VDD is not powered up.

Output drive disable circuit 254 pulls the signal DRV_P on node 293 to a high logic level ("$1_{VDDH}$"). In the preferred embodiment, disable circuit 254 is implemented with a PFET device having its source electrically coupled to the I/O power supply VDDH, its drain electrically coupled to node 293, and its gate controlled by a signal DISABLE_N. Signal DISABLE_N is the complementary signal of signal DISABLE, and is therefore logically low ("$0_{VDDH}$") whenever VDDH is powered up at the same time that VDD is not powered up.

The output drive disable circuits 252, 254 operate to ensure that the pullup output driver 291 is disabled from driving the output pad 295 until both power supplies VDD and VDDH are powered up. Initially, when both power supplies are powered down, or in the case when VDD powers up before VDDH, the pullup output driver FET 291 is disabled since its gate and source are both at the same level (ground).

In the case where VDDH powers up prior to VDD, signal DISABLE will go high. Consequently, signal DATA_PU$_{VDDH}$ will be pulled low ("$0_{VDDH}$") by disable circuit 226, and therefore signal DRV_P will go high ("$1_{VDDH}$"). Simultaneously, DISABLE_N will go low, which causes disable circuit 254 to pull signal DRV_P high ("$1_{VDDH}$"). When signal DRV_P is high ("$1_{VDDH}$"), pullup output driver FET 291 is electrically isolated from the output pad 295 and therefore is disabled from driving the output pad 295.

As described previously, in the case that VDD powers up prior to VDDH during the power up sequence, the pullup output driver 291 is disabled because its source and gate are at the same voltage level (essentially ground).

The output drive disable circuits 252, 254 also operate to ensure that the pullup output driver 291 is disabled from driving the output pad 295 during the power down sequence. In the case when VDDH powers down before VDD, the pullup output driver FET 291 is disabled since its gate and source are both at the same level (ground). In the case where VDD powers down prior to VDDH, signal DISABLE will go high. Consequently, signal DATA_PU$_{VDDH}$ will be pulled low ("$0_{VDDH}$") by disable circuit 252, and therefore signal DRV_P will go high ("$1_{VDDH}$"). Simultaneously, DISABLE_N will go low, which causes disable circuit 254 to pull signal DRV_P high ("$1_{VDDH}$"). When signal DRV_P is high ("$1_{VDDH}$"), pullup output driver FET 291 is electrically isolated from the output pad 295 and therefore is disabled from driving the output pad 295.

Turning now to the pulldown leg 202 of the output driver circuit 200, the pull-down leg 202 includes a dedicated pull-down level shifter 240 which receives a pull-down data signal DATA_$_{PDVDD}$ at an input 241. The pulldown level shifter operates identically to the level shifter described in FIG. 2, ultimately generating a level-shifted version DATA_PD$_{VDDH}$ of the pull-down data signal DATA_PD$_{VDD}$ at an output 244. In particular, series connected inverters 246 and 247 generate pull-down differential input signals ND_PD and NND_PD on nodes 242 and 243, which are used to control the input NFETs 251 and 252 respectively of the level shifter 240. The drains of the input NFETs 251 and 252 are cross-coupled to control the gates of respective output PFETs 254 and 253, which generate a differential output signal pair DATA_PD$_{VDDH}$, NDATA_PD$_{VDDH}$ on nodes 245 and 244 respectively. The output of the pull-down level shifter 240 is taken at the negative differential output node 244.

The pull-down leg 202 includes a pre-driver circuit 280 comprising a first complementary CMOS inverter comprising a PFET 285 electrically coupled between the I/O power supply VDDH at its source and a pull-down pre-driver output line 287 at its drain, and an NFET 286 electrically coupled between ground at its source and output line 287 at its drain. The input of the first complementary CMOS inverter is formed by connecting the gates of both PFET 285 and NFET 286 to line 244. The pre-driver circuit 280 also comprises a second complementary CMOS inverter comprising a PFET 281 electrically coupled between the I/O power supply VDDH at its source and a pull-down pre-driver output line 294 at its drain, and an NFET 282 electrically coupled between ground at its source and output line 294 at its drain. The input of the second complementary CMOS inverter is formed by connecting the gates of both PFET 281 and NFET 282 to line 287. Accordingly, the pre-driver circuit 280 receives the level-shifted output signal NDATA_PD$_{VDDH}$ on line 244 and outputs a pre-driver output signal DRV_N at the output of the pre-driver circuit 280 on line 294.

The pre-driver output signal DRV_N drives the pulldown output driver 292. In the preferred embodiment, the output driver 292 of the pull-down leg 202 is implemented with an NFET having a large drive strength. NFET 292 is electrically coupled between ground at its source and the output pad 295 at its drain. The pre-driver output line 294 is electrically coupled to the gate of NFET 292 such that the pre-driver output signal DRV_N controls whether NFET 292 is turned to an ON state to drive the output pad 295 to a "$0_{VDDH}$" by electrically connecting the output pad 295 to ground, or to and OFF state to isolate the output pad 295 from ground.

In accordance with the invention, the pull-down leg 202 includes power up/down pull-down output drive disable circuitry 256, 258. The power up/down pull-down output drive disable circuitry 256, 258 operates to disable the pull-down output driver NFET 292 so that it does not drive the output pad 295 during either power up or power down of the power supplies VDD and VDDH. In the preferred embodiment, the output drive disable circuitry 256, 258 includes a disable circuit 256 which pulls the signal NDATA_PD$_{VDDH}$ on node 244 to a low logic level ("$0_{VDDH}$") In the preferred embodiment, circuit 256 is implemented with an NFET device having its source electrically coupled to ground, its drain electrically coupled to node 244, and its gate controlled by the signal DISABLE.

The output drive disable circuitry 256, 258 also includes a disable circuit 258 which pulls the signal DRV_N on node 294 to a low logic level ("$0_{VDDH}$"). In the preferred embodiment, circuit 258 is implemented with an NFET device having its source electrically coupled to ground, its drain electrically coupled to node 294, and its gate controlled by the signal DISABLE.

During power up of the integrated circuit, the output drive disable circuitry 256, 258 operates to ensure that the pull-down output driver 292 is disabled from driving the output pad 295 until both power supplies VDD and VDDH are powered up. Initially, when both power supplies are powered off, or in the case when VDD powers up before VDDH, the pull-down output driver 292 is disabled since its gate and source are both at the same level (ground).

In the case where VDDH powers up prior to VDD, signal DISABLE will go high upon detection of this condition. Consequently, signal DATA_PD$_{VDDH}$ will be pulled low ("$0_{VDDH}$") by disable circuit 256, and therefore signal DRV_N will go high ("$0_{VDDH}$"). Simultaneously, signal DISABLE will go high, which causes disable circuit 258 to pull signal DRV_N low ("$0_{VDDH}$"). When signal DRV_N is low ("$0_{VDDH}$"), pull-down output driver FET 292 is electrically isolated from the output pad 295 and therefore is disabled from driving the output pad 295.

The output drive disable circuitry 256, 258 also operates to ensure that the pull-down output driver 292 is disabled from driving the output pad 295 once one or both of the power supplies VDD and VDDH are powered down. In the case when VDDH powers down before VDD, the pull-down output driver 292 is disabled since its gate and source are both at the same level (ground).

In the case where VDD powers down prior to VDDH, signal DISABLE will go high, consequently, disable circuit 258 will pull signal DRV_N low ("$0_{VDDH}$"). When signal DRV_N is low ("$0_{VDDH}$"), pull-down output driver 292 is electrically isolated from the output pad 295 and therefore is disabled from driving the output pad 295.

Figure 5:
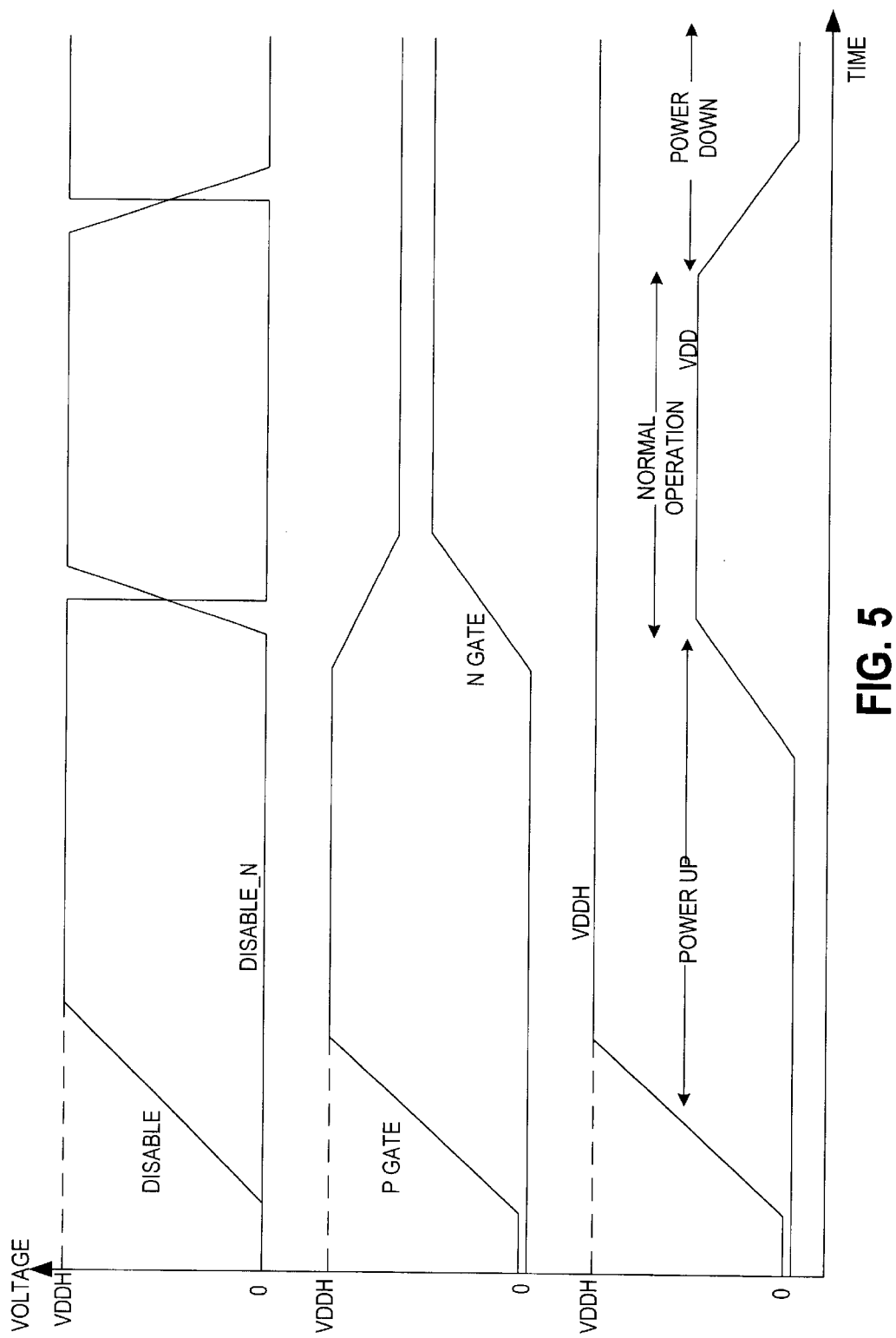
FIG. 5 is a timing diagram illustrating the relationships of various output driver signals during power up and power down of an integrated circuit implemented in accordance with the invention.

FIG. 5 shows the relationships of the signals VDDH, VDD, DISABLE, and DISABLE_N during a power up sequence when VDD powers up after VDDH, during normal operation of the integrated circuit after both VDD and VDDH are powered up, and during a power down sequence when VDD powers down before VDDH.

Figure 6:
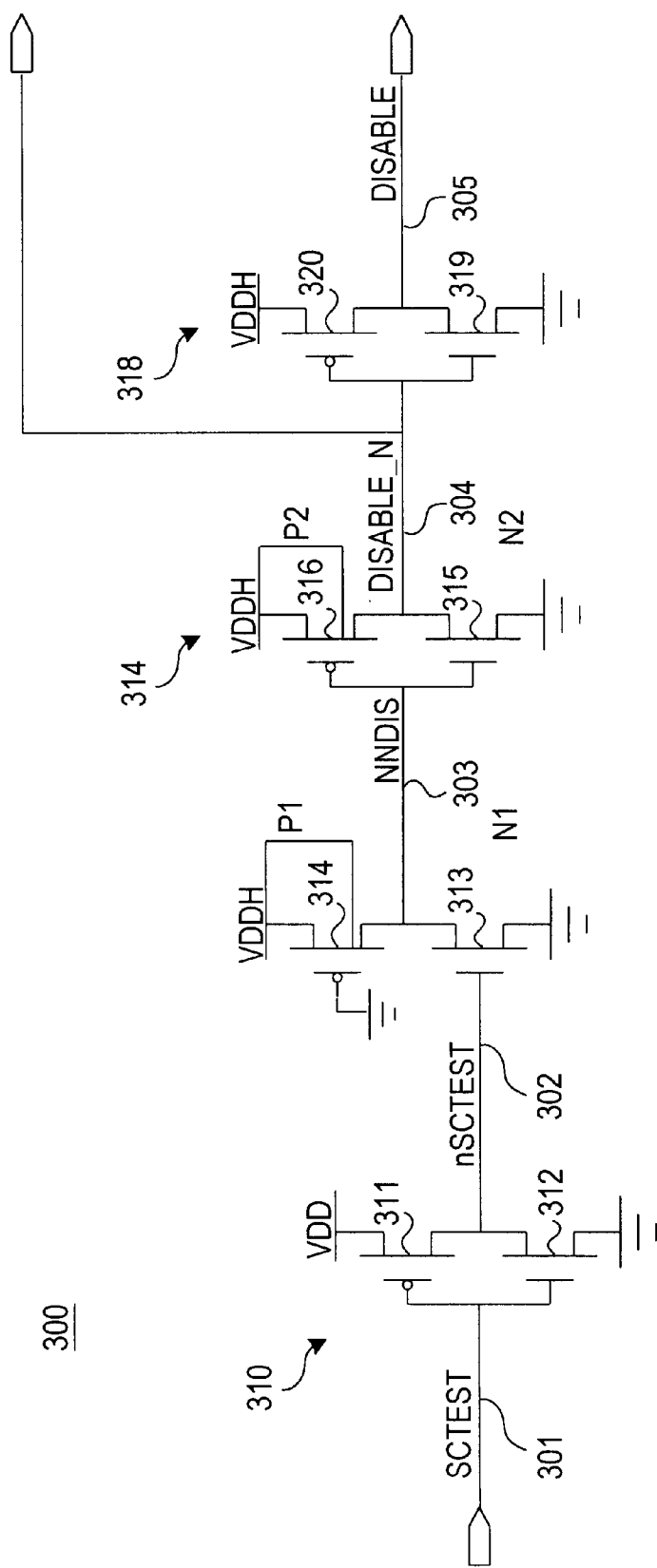
FIG. 6 is a schematic diagram of one preferred embodiment of an output driver disabling circuit implemented in accordance with the invention.

FIG. 6 is a schematic diagram of one preferred embodiment 300 of power supply monitoring circuit 70 (FIG. 3) for generating the complementary DISABLE and DISABLE_N signals (FIG. 4). As described previously, signal DISABLE is logically high ("$1_{VDDH}$") whenever VDDH is powered up and VDD is not powered up, and signal DISABLE_N is the logical complement of signal DISABLE. In the preferred embodiment, the static current test signal SCTEST is used to generate the DISABLE and DISABLE_N signals. As known in the art, most integrated circuits provide a static current test input for uncovering internal bridging, shorts, and gate-oxide defects in the integrated circuit. The static current test is performed after manufacture prior to shipping. During normal operation of the chip, this input is tied to ground and is therefore guaranteed to always be at ground.

The circuit 300 includes a first inverter 310 comprising complementary CMOS devices 311 and 312 connected to form an inverter in a manner well-known in the art as shown. The PFET device 311 is connected to the core-level power supply VDD at its source, an output line 302 at its drain, and the input line 301 at its gate. The NFET device 312 is connected to the chip ground at its source, the output line 302 at its drain, and the input line 301 at its gate.

The output line 302 is connected to drive the gate of an NFET device 313 that is connected between the chip ground at its source, and a line 303 at its drain. A PFET device 314 is connected between the I/O power supply VDDH at its source, and the line 303 at its drain. The gate of the PFET device is tied to ground, and therefore is guaranteed to be on so long as the I/O power supply VDDH is powered up.

Line 303 drives the input of a second inverter 314 formed by complementary CMOS devices including NFET 315 and PFET 316. PFET 316 is connected to the I/O power supply VDDH at its source, an inverter output line 304 at its drain, and the inverter input line 303 at its gate. The NFET device 315 is connected to the chip ground at its source, the inverter output line 304 at its drain, and the inverter input line 303 at its gate.

The inverter output line 304 drives the input of a third inverter 318 formed by complementary CMOS devices including NFET 319 and PFET 320. PFET 320 is connected to the I/O power supply VDDH at its source, an output line 305 at its drain, and the line 304 at its gate. The NFET device 319 is connected to the chip ground at its source, the output line 305 at its drain, and the line 304 at its gate.

The signal DISABLE is taken on line 305 and the complementary signal DISABLE_N taken on line 304.

In operation, signal SCTEST input on line 301 is guaranteed to be low ("$0_{VDDH}$"). In the case that VDDH powers up before VDD, inverter 310 will be disabled since the source of PFET 311 of inverter 310 is essentially at ground. Accordingly, signal nSCTEST on line 302 will be logical low ("$0_{VDDH}$") and therefore NFET 313 will be off. Signal NNDIS on line 303 will therefore be logical high ("$1_{VDDH}$") since whenever VDDH is powered up PFET 314 is guaranteed to be on. Signal NNDIS drives the second inverter 314, producing signal DISABLE_N on line 304 having a logical low ("$0_{VDDH}$") value. The third inverter 318 receives signal DISABLE_N on line 304 and produces signal DISABLE having a logical high ("$1_{VDDH}$") value at its output on line 305. Accordingly, signal DISABLE is logically high whenever power supply VDDH is powered up and power supply VDD is not powered up.

In the case that VDD powers up before VDDH, the second and third inverters 314 and 318 are both disabled since the source of respective PFETs 316 and 320 are both at ground.

Once both power supplies VDD and VDDH are powered up, the first inverter 310 produces a logical high value ("$1_{VDDH}$") on line 302, thereby turning on NFET 313, which pulls signal NNDIS on line 303 to a logical low value ("$0_{VDDH}$"). NFET 313 is sized to have a higher drive strength than PFET 314 so that NFET 313 easily overpowers PFET 314 to pull down node 303. Signal NNDIS is inverted a first time by inverter 314 to pull signal DISABLE_N to a logical high value ("$1_{VDDH}$"), and is inverted a second time by inverter 318 to pull signal DISABLE to a logical low value ("$0_{VDDH}$"). Accordingly, signal DISABLE is logically low whenever both power supplies VDD and VDDH are powered up (i.e., during normal operation of the integrated circuit).

Turning back to FIG. 4, in accordance with the preferred embodiment of the invention, the pre-driver circuits 260, 280 include process/voltage/temperature (PVT) adjustment circuitry implemented with FET devices 263, 264, 283, 284 (91, 92, 93, 94 in FIG. 3) to allow the source resistance of the pre-driver drive devices 261, 262 and 281, 282 to be adjusted based on the process sizing parameters, voltage, and temperature of the integrated circuit. The PVT adjustment FETs 263, 264, 283, 284 are responsive to a pre-driver resistance control circuit 90 (FIG. 3) which adjusts the source resistance of the PVT adjustment FETs 263, 264, 283, 284 to speed up or slow down the rate of current flow through the pre-driver drive devices 261, 262, and 281, 282, respectively, in order to adjust the slew rate of the respective pull-down and pull-down pre-drive signals DRV_P and DRV_N. This in turn directly affects the slew rate of the signal on the output pad 295.

The signals PGATE and NGATE control the drive strength of the pullup and pulldown devices 291 and 292 over variations in process, voltage, and temperature. PGATE and NGATE control the current and thus the edge rate going into the final drive devices 291 and 292. PGATE is capacitively coupled to the VDDH power supply and thus tracks VDDH during power up and power down. Similarly, signal NGATE is capacitively coupled to ground and thus tracks ground during power up and power down. Accordingly, during power up, if VDDH is powered up while VDD is still powered down, signal PGATE will be at or near VDDH; thus, in the pullup leg, PVT adjustment FET 263 will be off, isolating the pre-driver PFET 261 from VDDH and preventing the pre-driver 260 from driving signal DRV_P. Similarly, PVT adjustment FET 264 will be off, isolating the pre-driver NFET 262 from ground. Similarly, in the pull-down leg, PVT adjustment FET 283 will be off, isolating the pre-driver PFET 281 from VDDH, and PVT adjustment FET 284 will be off, isolating the pre-driver NFET 282 from ground. Accordingly, the PGATE and NGATE signals from the pre-driver device control circuit 90 disable the pre-drivers 260, 280 of the output driver. Since nothing is driving the final output driver devices 291 and 292, the disable circuits 254 and 258 actively turn off the output driver devices 291 and 292.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. An output driver for driving a signal onto a pad of an integrated circuit, comprising:
   a level-shifter which receives a core-level data signal indicating a logic value based on a core power supply levels, and generates an I/O-level data signal indicating a logic value based on an I/O power supply levels;
   a pre-driver circuit which receives said I/O-level data signal and generates a pre-drive signal having a drive state indicating to drive said pad and a non-drive state indicating not to drive said pad;
   a drive device responsive to said pre-drive signal which drives said I/O-level data signal onto said pad when said pre-drive signal is in said drive state; and
   a driver disabling circuit which disables said drive device from driving said pad when said I/O power supply is powered up and said core power supply is powered down.

2. An output driver in accordance with claim 1, wherein said driver disabling circuit comprises:
   a pre-driver control circuit which disables current flow to said pre-driver circuit during power up and/or power down of said I/O power supply.

3. An output driver in accordance with claim 2, wherein:
   said pre-driver control circuit comprises a process/voltage/temperature (PVT) adjustment circuit that adjusts said current flow to said pre-driver circuit in response to a PVT control signal when both said core power supply and said I/O power supply are powered up, and prevents current flow to said pre-driver circuit when said core power supply and said I/O power supply are not both powered up.

4. An output driver in accordance with claim 3, wherein said driver disabling circuit further comprises:
   a power supply monitoring circuit which monitors said core power supply and said I/O power supply and generates a disable signal when said core power supply is powered down while said I/O power supply is powered up; and
   a disabling circuit which actively pulls said pre-drive signal to said non-drive state upon detection of said disable signal.

5. An output driver in accordance with claim 4, comprising:
   a circuit for monitoring whether said core power supply is powered off while said I/O power supply is powered on, said circuit comprising:
      a first inverter powered by said core power supply having a first inverter input and a first inverter output;
      a first FET device having a first FET source coupled to ground, a first FET drain, and a first FET gate coupled to said first inverter output;
      a second FET device having a second FET source coupled to said I/O power supply, a second FET drain, and a second FET gate connected to ground;
      a second inverter powered by said I/O power supply having a second inverter input coupled to said first FET drain and said second FET drain, and a second inverter output; and
      a third inverter powered by said I/O power supply having a third inverter input coupled to said second inverter output and a third inverter output on which said disable signal is output.

6. An output driver in accordance with claim 1, wherein said driver disabling circuit comprises:
   a power supply monitoring circuit which monitors said core power supply and said I/O power supply and generates a disable signal when said core power supply is powered down while said I/O power supply is powered up; and
   a disabling circuit which actively pulls said pre-drive signal to said non-drive state upon detection of said disable signal.

7. An output driver in accordance with claim 6, comprising:

a circuit for monitoring whether said core power supply is powered off while said I/O power supply is powered on, said circuit comprising:
  a first inverter powered by said core power supply having a first inverter input and a first inverter output;
  a first FET device having a first FET source coupled to ground, a first FET drain, and a first FET gate coupled to said first inverter output;
  a second FET device having a second FET source coupled to said I/O power supply, a second FET drain, and a second FET gate connected to ground;
  a second inverter powered by said I/O power supply having a second inverter input coupled to said first FET drain and said second FET drain, and a second inverter output; and
  a third inverter powered by said I/O power supply having a third inverter input coupled to said second inverter output and a third inverter output on which said disable signal is output.

8. An output driver for driving a signal onto a pad of an integrated circuit, comprising:
  a pullup leg for pulling said pad to a logic high level, said pulldown leg comprising:
    a pullup level-shifter which receives a core-level pullup data signal indicating a pullup logic value based on core power supply levels, and generates an I/O-level pullup data signal indicating said pullup logic value based on I/O power supply levels;
    a pullup pre-driver circuit which receives said I/O-level pullup data signal and generates a pullup pre-drive signal having a pullup drive state indicating to drive said pad and a pullup non-drive state indicating not to drive said pad;
    a pullup drive device responsive to said pullup pre-drive signal which drives said I/O-level pullup data signal onto said pad when said pullup pre-drive signal is in said pullup drive state; and
    a pullup driver disabling circuit which disables said pullup drive device from driving said pad when a I/O power supply is powered up and a core power supply is powered down; and
  a pulldown leg for pulling said pad to a logic low level, said pulldown leg comprising:
    a pulldown level-shifter which receives a core-level pulldown data signal indicating a pulldown logic value based on said core power supply levels, and generates an I/O-level pulldown data signal indicating said pulldown logic value based on said I/O power supply levels;
    a pulldown pre-driver circuit which receives said I/O-level pulldown data signal and generates a pulldown pre-drive signal having a pulldown drive state indicating to drive said pad and a pulldown non-drive state indicating not to drive said pad;
    a pulldown drive device responsive to said pulldown pre-drive signal which drives said I/O-level pulldown data signal onto said pad when said pulldown pre-drive signal is in said pulldown drive state; and
    a pulldown driver disabling circuit which disables said pulldown drive device from driving said pad when said I/O power supply is powered up and said core power supply is powered down.

9. An output driver in accordance with claim 8, wherein:
said pullup driver disabling circuit comprises:
  a pullup pre-driver control circuit which disables current flow to said pullup pre-driver circuit during power up and/or power down of said I/O power supply; and
said pulldown driver disabling circuit comprises:
  a pulldown pre-driver control circuit which disables current flow to said pulldown pre-driver circuit during power up and/or power down of said I/O power supply.

10. An output driver in accordance with claim 9, wherein:
each said pullup pre-driver control circuit and said pulldown pre-driver control circuit comprises:
  a process/voltage/temperature (PVT) adjustment circuit that adjusts said current flow to said respective pullup and pulldown pre-driver circuits in response to a PVT control signal when both said core power supply and said I/O power supply are powered up, and prevents current flow to said respective pullup and pulldown pre-driver circuits when said core power supply and said I/O power supply are not both powered up.

11. An output driver in accordance with claim 10, further comprising:
  a power supply monitoring circuit which monitors said core power supply and said I/O power supply and generates a disable signal when said core power supply is powered down while said I/O power supply is powered up; and
  a disabling circuit which actively pulls said respective pullup and pulldown pre-drive signals to said respective pullup and pulldown non-drive states upon detection of said disable signal.

12. An output driver in accordance with claim 11, wherein:
said power supply monitoring circuit comprises:
  a first inverter powered by said core power supply having a first inverter input and a first inverter output;
  a first FET device having a first FET source coupled to ground, a first FET drain, and a first FET gate coupled to said first inverter output;
  a second FET device having a second FET source coupled to said I/O power supply, a second FET drain, and a second FET gate connected to ground;
  a second inverter powered by said I/O power supply having a second inverter input coupled to said first FET drain and said second FET drain, and a second inverter output; and
  a third inverter powered by said I/O power supply having a third inverter input coupled to said second inverter output and a third inverter output on which said disable signal is output.

13. An output driver in accordance with claim 8, further comprising:
  a power supply monitoring circuit which monitors said core power supply and said I/O power supply and generates a disable signal when said core power supply is powered down while said I/O power supply is powered up; and
  a disabling circuit which actively pulls said respective pullup and pulldown pre-drive signals to said respective pullup and pulldown non-drive states upon detection of said disable signal.

14. An output driver in accordance with claim 13, wherein:
said power supply monitoring circuit comprises:
  a first inverter powered by said core power supply having a first inverter input and a first inverter output;
  a first FET device having a first FET source coupled to ground, a first FET drain, and a first FET gate coupled to said first inverter output;

a second FET device having a second FET source coupled to said I/O power supply, a second FET drain, and a second FET gate connected to ground;

a second inverter powered by said I/O power supply having a second inverter input coupled to said first FET drain and said second FET drain, and a second inverter output; and a third inverter powered by said I/O power supply having a third inverter input coupled to said second inverter output and a third inverter output on which said disable signal is output.

15. A method for preventing high-current shorts between an I/O power supply and ground through a pad of an integrated circuit during power up and power down of said integrated circuit, said integrated circuit comprising functional internal circuitry powered by a core power supply and an integrated circuit pad powered by an I/O power supply, said method comprising:

monitoring said core power supply and said I/O power supply;

detecting when said I/O power supply is powered up and said core power supply is powered down; and disabling said integrated circuit pad upon said detection that said I/O power supply is powered up and said core power supply is powered down.

16. A method in accordance with claim 15, wherein said disabling step comprises:

preventing current flow through a pre-driver device of an output driver driving said pad.

17. A method in accordance with claim 16, wherein said disabling step further comprises:

actively pulling a pre-driver signal which drives a pad driving device to a disable state.

18. A method in accordance with claim 15, wherein said disabling step further comprises:

actively pulling a pre-driver signal which drives a pad driving device to a disable state.

* * * * *